United States Patent
Oka (10) Patent No.: US 7,276,791 B2
(45) Date of Patent: Oct. 2, 2007

(54) BOARD HAVING ALTERNATING ROWS OF PROCESSORS AND MEMORIES

(75) Inventor: Masaaki Oka, Tokyo (JP)

(73) Assignee: Sony Computer Entertainment Inc. (JP)

( * ) Notice: Subject to any disclaimer, the term of this patent is extended or adjusted under 35 U.S.C. 154(b) by 94 days.

(21) Appl. No.: 11/248,310

(22) Filed: Oct. 12, 2005

(65) Prior Publication Data

US 2006/0038270 A1    Feb. 23, 2006

Related U.S. Application Data

(62) Division of application No. 10/262,789, filed on Oct. 2, 2002, now abandoned.

(30) Foreign Application Priority Data

Oct. 2, 2001   (JP) ............... 2001-306880
Sep. 17, 2002   (JP) ............... 2002-270145

(51) Int. Cl.
   *H01L 23/34*   (2006.01)
   *H05K 7/00*    (2006.01)
(52) U.S. Cl. .............. 257/724; 257/786; 361/777; 361/783
(58) Field of Classification Search ............ None
   See application file for complete search history.

(56) References Cited

U.S. PATENT DOCUMENTS

| 4,858,072 A | 8/1989 | Chall, Jr. |
| 5,340,772 A | 8/1994 | Rosotker |
| 5,347,428 A | 9/1994 | Carson et al. |
| 5,434,453 A | 7/1995 | Yamamoto et al. |
| 5,748,872 A * | 5/1998 | Norman ................ 714/11 |
| 6,111,756 A | 8/2000 | Moresco |
| 6,291,309 B1 | 9/2001 | Ikeda et al. |
| 6,479,306 B1 | 11/2002 | Ikeda et al. |
| 6,864,524 B2 | 3/2005 | Masleid et al. |

FOREIGN PATENT DOCUMENTS

| JP | 53045987 | 4/1978 |
| JP | 55009217 | 1/1980 |
| JP | 04000659 | 1/1992 |
| JP | 11 330257 | 11/1999 |
| JP | 2001 077056 | 3/2001 |
| JP | 2001 177046 | 6/2001 |

* cited by examiner

*Primary Examiner*—Alonzo Chambliss
(74) *Attorney, Agent, or Firm*—Lerner, David, Littenberg, Krumholz & Mentlik, LLP (57) ABSTRACT

An electronic device is provided on which semiconductor packages can be mounted efficiently. The electronic device includes a board that can receive a plurality of first semiconductor packages each carrying a processor device and a plurality of second semiconductor packages each carrying a memory device. Mount regions where the packages are to be mounted and non-mount regions are alternately arranged in rows and columns on the board. This ensures approximately equal wiring distances between the packages, allowing processor devices to access associated memory devices at the same time.

8 Claims, 8 Drawing Sheets

BOARD HAVING ALTERNATING ROWS OF PROCESSORS AND MEMORIES

CROSS REFERENCE TO RELATED APPLICATIONS

The present application is a divisional of U.S. application Ser. No. 10/262,789, filed Oct. 2, 2002, now abandon, which claims priority from Japanese Application Nos. 2001-306880, filed Oct. 2, 2001, and 2002-270145, filed Sep. 17, 2002, the disclosures of which are hereby incorporated by reference herein.

BACKGROUND OF THE INVENTION

The present invention relates to an electronic device on which a plurality of semiconductor packages can be mounted, a semiconductor package on which a plurality of semiconductor devices can be mounted, a semiconductor device on which a plurality of function implementation segments are formed, and a method for establishing an information processing environment.

Semiconductor packages are a package product which is mounted on some or all mount regions on a board for electronic devices and which includes active devices comprising active cells, such as processors, or passive devices comprising passive cells, such as memories. Semiconductor devices are, for example, an integrated circuit which is mounted on some or all mount regions on a board for semiconductor packages and which includes function implementation segments with an active function, such as processors, or function implementation segments with a passive function, such as memories. Function implementation segments are electronic circuits comprising semiconductor cells and electronic parts that are provided on a semiconductor device.

Recent demands for smaller computer systems have resulted in increasing attention to electronic devices in which a plurality of semiconductor packages are mounted on a board. In such electronic devices, the arrangement of a plurality of semiconductor packages on a board is determined considering the details of processing to be carried out by the semiconductor device(s) mounted on each semiconductor package, as well as throughputs, processing time, and the position of input and output terminals of the semiconductor packages.

For example, for an electronic device that carries out necessary processing by using two or more semiconductor packages (hereinafter, referred to as "memory packages") on which a semiconductor memory device (hereinafter, referred to as a "memory device") where digital information is recorded is mounted, and two or more other semiconductor packages (hereinafter, referred to as "processor packages") on which a semiconductor processor device (hereinafter, referred to as a "processor device") that performs predetermined calculation operations is mounted, i.e., for an electronic device in which each processor device seeks to access each memory device to execute processing, the arrangement of the memory packages and the processor packages on a board is determined based on, for example, which memory device stores the digital information to be processed by the processor device.

In general, when a processor device reads the digital information on a plurality of memory devices for a predetermined processing, it is necessary to ensure efficient processing by controlling the access from the processor devices to the memory devices at the same time. Processor devices must be arranged so that they never cross wiring with other semiconductor packages. A smaller electronic device can be produced with a board having as many semiconductor packages as possible.

This also applies to where a plurality of processor devices and a plurality of memory devices are mounted on a single semiconductor package. In addition, the same applies where a plurality of function implementation segments each having a function as a processor and a plurality of function implementation segments each having a function as a memory are formed on a single semiconductor device.

Taking the above into consideration, an object of the present invention is to provide an electronic device that ensures efficient execution of desired processing and allows an increased number of semiconductor packages to be mounted thereon.

Another object of the present invention is to provide a semiconductor package that ensures efficient execution of desired processing and allows more semiconductor packages to be mounted thereon.

A still another object of the present invention is to provide a semiconductor device that ensures efficient execution of desired processing and allows more function implementation segments to be formed thereon.

Another object of the present invention is to provide a method for establishing an information processing environment.

SUMMARY OF THE INVENTION

An electronic device according to the present invention includes a plurality of mount regions provided in the electronic device, each of the mount regions being electrically interconnected to other of the mount regions; a semiconductor package mounted on each of at least two of the mount regions, each of the semiconductor packages being electrically interconnected to other of the semiconductor packages so that each of the semiconductor packages can implement a desired function in cooperation with the other of the semiconductor packages to which it is electrically interconnected; each of the mount regions being positioned in the electronic device so that each of the semiconductor packages is spaced from adjacent semiconductor packages by a wiring distance, the wiring distance between each adjacent pair of semiconductor packages being about the same.

As is apparent from the above, the wiring distances are equal or approximately equal between the adjacent function implementation segments, between the adjacent semiconductor devices, and between the adjacent semiconductor packages. Accordingly, information can be exchanged at the same time among the function implementation segments, among the semiconductor devices, and among the semiconductor packages.

Specific examples of the electronic device include those further including a board; and at least one non-mount region on which no semiconductor package is mounted; the mount regions and the non-mount regions having rectangular shapes of equal size and being alternately arranged in rows and columns on the board to form a matrix pattern. When the rectangular regions are not arranged to have a matrix pattern on the board, specific examples of the electronic device also include those in which the mount regions have a rectangular shape and a size, the size of each of the mount regions being the same, the mount regions being arranged in rows and columns on the board with almost no gap between adjacent ones of the mount regions; those in which the mount regions have a regular hexagonal shape and a size, the size of each of the mount regions being the same, the mount regions being arranged in a honeycomb pattern on the board; those in which the mount regions have a triangular shape and a size, the size of each of the mount regions being the same, the mount regions being arranged on the board with almost no gap between adjacent ones of the mount regions; those in which each of the mount regions is a combination of at least two triangular regions of equal size, the combinations being arranged on the board with almost no gap between adjacent ones of the mount regions; and those in which the plurality of mount regions include a first group of mount regions having a first shape and a second group of mount regions having a second shape different from the first shape, each of the mount regions being arranged on the board so that a side of a mount region of the first group is opposed to a side of a mount region of the second group, and with almost no gap between the side of the mount region of the first group and the side of the mount region of the second group.

In any cases, the mounting surface of the semiconductor package is configured so that the semiconductor packages can be mounted side by side. Preferably, each of the mount regions has a shape, and each of the semiconductor packages includes a mounting surface having a shape, the shape of each of the mounting surfaces being the same as the shape of the mount region on which the semiconductor package is mounted.

The electronic devices having any one of the above-mentioned configurations allows efficient mounting of a larger number of semiconductor packages on a single board.

In such electronic devices, for example, each of the semiconductor packages includes a semiconductor device, for each of the semiconductor packages, the semiconductor device in the semiconductor package mounted on one of the mount regions being different from the semiconductor device in the semiconductor package mounted on another of the mount regions adjacent to the one of the mount regions. For example, the one mount region may include a semiconductor package (an active device package) having an active device (e.g., a processor device), and the another of the mount regions may include a semiconductor package (a passive device package) having a passive device (e.g., a memory device on which digital information is stored that is to be read by the processor device). The electronic device may further include a plurality of active device packages, each of the active device packages including an inactive device, each of the active device packages being mounted on a mount region adjacent to the another of the mount regions, the passive device being shared among the active devices. This configuration eliminates the need to provide more passive devices than necessary, reducing the size of the resulting electronic device. In addition, digital information obtained as a result of certain processing can be exchanged between the active devices in the active device packages that are not directly interconnected to each other through a shared passive device. Conventionally, the acquisition of a processing result that is obtained by other active devices requires access to the passive device storing the processing result of the corresponding active device through the active device that has performed the relevant processing. On the contrary, the present invention makes it possible to obtain processing results of other active devices at a higher speed.

The electronic device may include a plurality of passive device packages, each of the passive device packages including a passive device, each of the passive device packages being mounted on a mount region adjacent to the one of the mount regions, the active device communicating with each of the passive devices. This allows each active device to distribute and store digital information in the passive devices that are mounted on the adjacent mount regions. The access time from the active device to the passive device becomes equal for all combinations, increasing the speed of processing to be carried out by the active devices.

DETAILED DESCRIPTION OF THE PREFERRED EMBODIMENTS

Embodiments of an electronic device according to the present invention are described below with reference to the drawings.

First Embodiment

Described first is an electronic device which includes a board carrying a plurality of mount regions on which semiconductor packages are to be mounted and a plurality of non-mount regions on which no semiconductor package is to be mounted. In this example, mounting surfaces (the term "mounting surface" as used herein means the back surface of a package opposite the corresponding mount region) of the semiconductor packages, the mount regions, and the non-mount regions are rectangles of equal size. The semiconductor packages to be mounted are processor packages each carrying a processor device which is an example of an active device and memory packages each carrying a memory device which is an example of a passive device. However, the semiconductor packages may be those carrying other kinds of semiconductor devices.

Figure 1:
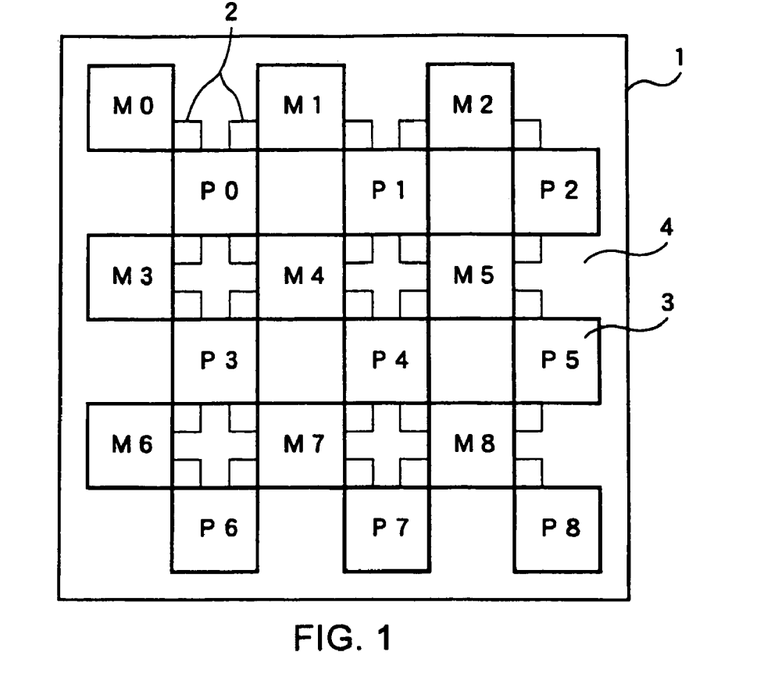
FIG. 1 is a plan view showing an example of a board in an electronic device according to a first embodiment of the present invention.

FIG. 1 is a plan view showing an example of a board in an electronic device according to this embodiment. A non-mount region 4 is provided between each adjacent pair of mount regions 3 on the board 1. The mount regions 3 and the non-mount regions 4 are alternately arranged in rows and columns on the board 1. The board in FIG. 1 carries memory packages M0 to M8 and processor packages P0 to P8.

The processor package P0 is interconnected to the memory packages M0, M1, M3, and M4 through the wiring 2. The data associated with the processing carried out by the processor device in the processor package P0 (e.g., data to be used for processing or data obtained as a result of processing) are distributed over, stored in, and read out of the memory devices in the memory packages M0, M1, M3, and M4. The same applies to other processor packages. More specifically, the processor package P1 is interconnected to the memory packages M1, M2, M4, and M5. The processor package P3 is interconnected to the memory packages M3, M4, M6, and M7. The processor package P4 is interconnected to the memory packages M4, M5, M7, and M8. Thus, the adjacent four memory packages are interconnected to each other. The data associated with processing are distributed over, stored in, and read out of the memory devices in these memory packages.

For the processor packages P2, P5, P6, P7, and P8, only one or two memory packages are shown just for ease of illustration.

Taking particular note of the memory packages, the memory devices in a single memory package are shared among the processor devices in a plurality of processor packages. In this case, the same storage region may be shared. Alternatively, where there is enough storage capacity, the storage region may be divided into the same number of blocks as the number of processors among which the storage region is to be shared, and the blocks of the storage region may be allocated among the processor devices.

For example, the memory device in the memory package M4 is shared among the processor devices in the processor packages P0, P1, P3, and P4. The memory device in the memory package M5 is shared among the processor devices in the processor packages P1, P2, P4, and P5. Likewise, the memory device in the memory package M7 is shared among the processor devices in the processor packages P3, P4, P6, and P7. The memory device in the memory package M8 is shared among the processor devices in the processor packages P4, P5, P7, and P8.

For the other memory packages M0, M1, M2, M3, and M6, only one or two processor packages are shown just for ease of illustration.

The processor packages P0 to P8 may be allowed to access the memory devices in the memory packages M0 to M8, respectively, depicted with the same suffix to store and read the data (e.g., the processor package P0 is allowed to access the memory package M0, the processor package P1 is allowed to access the memory package M1, and so on).

The above-mentioned arrangement of the processor packages and the memory packages on the board 1 ensures equal or approximately equal electrical wiring distances between the semiconductor packages on the adjacent mounting regions 3. When the semiconductor packages cooperate with each other to implement a certain desired function, digital information can be exchanged for an equal transmission period between any pairs of packages. In addition, the wiring 2 may be patterned, with a possible reduction in manufacturing costs for a board 1 for multi-processor systems.

As apparent from the above, a plurality of memory packages (each carrying a shared memory device) are arranged around a given processor package. The wiring distance is approximately equal for all pairs of processor devices and the memory devices on these packages. Therefore, each processor device can use a plurality of memory devices at the same time, making good use of the processor devices. Each processor device can use the data associated with the processing carried out by the other three processor devices that surround the same single memory device, through that memory device. This also improves the efficiency of processing.

While the semiconductor packages in this embodiment are of equal size, the present invention is not limited to such a configuration. The memory packages and the processor packages may be of different size.

Second Embodiment

Figure 2:
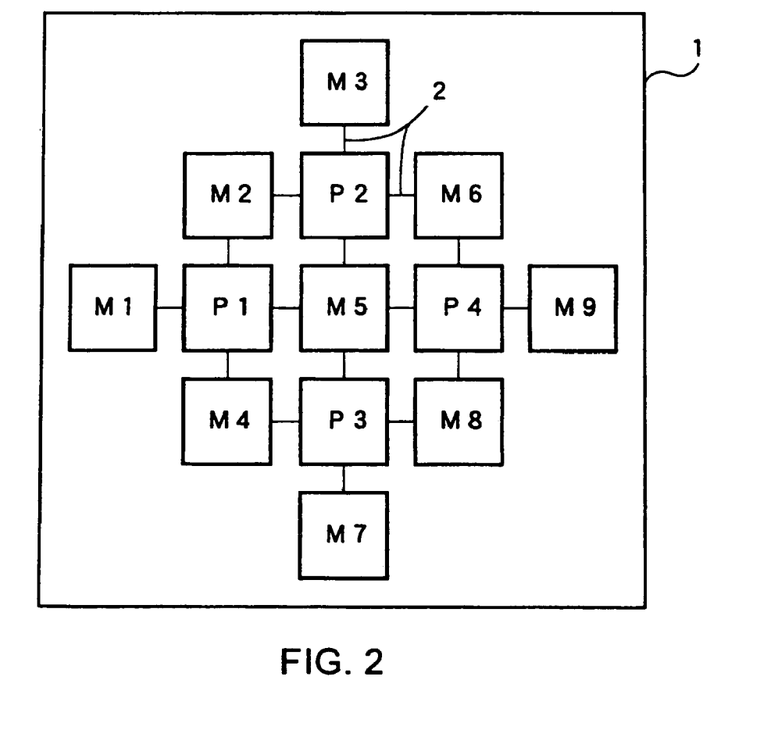
FIG. 2 is a plan view showing an example of a board in an electronic device according to a second embodiment of the present invention.

FIG. 2 is a plan view showing an example of a board in an electronic device according to a second embodiment.

In this embodiment, rectangular mount regions of equal size are provided on a board in an electronic device. However, unlike the first embodiment, non-mount regions are not provided. Instead, the mount regions are provided on the board almost without a gap between them. The mounting surface of the semiconductor package to be mounted is rectangular and equal in size to the mount region. The board in FIG. 2 carries memory packages M1 to M9 and processor packages P1 to P4. For convenience, the board and the wiring are depicted by the reference numerals 1 and 2, respectively, as in the first embodiment.

All mount regions that are arranged side-by-side in this embodiment carry different kinds of semiconductor packages from each other. The mount regions arranged in the diagonal directions carry the same kind of semiconductor packages.

The processor package P1 is interconnected through the wiring 2 to the memory packages M1, M2, M4, and M5 that are adjacent to the processor package P1 in the vertical and horizontal directions. The data associated with the processing carried out by the processor device in the processor package P1 are distributed over, stored in, and read out of the memory devices in the four memory packages M1, M2, M4, and M5. Likewise, the processor packages P2, P3, and P4 are interconnected to their respective adjacent memory packages in the vertical and horizontal directions. The data associated with processing are distributed over, stored in, and read out of the memory devices in the relevant four memory packages.

Taking particular note of the memory packages, for example, the memory package. M5 is interconnected to four processor packages P1 to P4. The memory device on the memory package M5 is shared among the four processor devices. In this case, the same storage region may be shared. Alternatively, where there is enough storage capacity, the storage region may be divided into the same number of blocks as the number of processors among which the storage region is to be shared, and the blocks of the storage region may be allocated among the processor devices. More specifically, the storage region in the memory device may be divided into four blocks. The blocks of the storage region are allocated among the processor devices in the processor packages P1 to P4, respectively. The same applies to the other memory packages. Each memory device is shared among the processor devices in the opposing processor packages. The divided blocks of the storage region are allocated among the respective processor devices.

This embodiment also ensures equal or approximately equal electrical wiring distances between the processor packages and the memory packages. Accordingly, digital information can be exchanged for an equal transmission period between any pairs of packages. In addition, the wiring may be patterned, with a possible reduction in manufacturing costs for a board 1 for multi-processor systems.

As apparent from the above, four memory packages (each carrying a shared memory device) are arranged around a given processor package. The memory packages can be used at the same time, making good use of the processor devices. Each processor device can use the data associated with the processing carried out by the other three processor devices that surround the same single memory device, through that memory device. This also improves the efficiency of processing.

The configuration without the non-mount regions according to the second embodiment of the present invention provides a larger available area for increasing the number of semiconductor packages, thereby reducing the size of a resulting electronic device.

Third Embodiment

Figure 3:
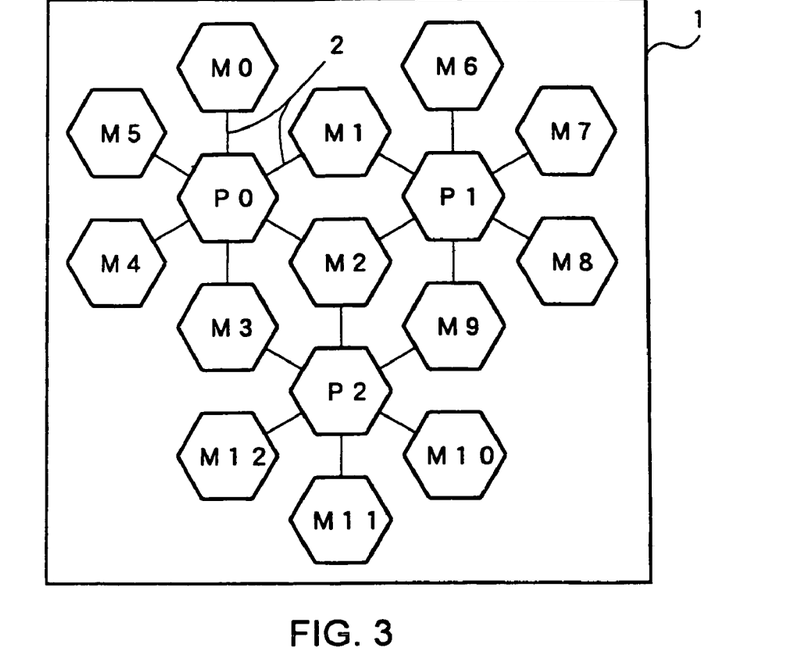
FIG. 3 is a plan view showing an example of a board in an electronic device according to a third embodiment of the present invention.

FIG. 3 is a plan view showing an example of a board in an electronic device according to a third embodiment.

In this embodiment, a plurality of hexagonal, preferably regular hexagonal mount regions of equal size are provided in a honeycomb pattern on a board in an electronic device. The mounting surfaces of the semiconductor packages to be mounted are all hexagonal. The board in Feb. 3 carries memory packages M0 to M12 and processor packages P0 to P2. For convenience, the board and the wiring are depicted by the reference numerals 1 and 2, respectively, as in the first embodiment.

The packages are mounted so that the six sides of each processor package are opposed to one side of each of the surrounding six memory packages. For example, the six memory packages M0 to M5 are provided around the processor package P0 so that the sides of the processor package P0 are opposed to one side of each of the memory packages M0 to M5. The same applies to the other processor packages. More specifically, the six memory packages M1, M2, and M6 to M9 are provided around the processor package P1. The six memory packages M2, M3, and M9 to M12 are provided around the processor package P2.

The data associated with the processing carried out by the processor devices in the processor packages are distributed over, stored in, and read out of the memory devices in the surrounding six memory packages interconnected to the relevant processor package.

Taking particular note of the memory packages, for example, the memory package M2 is interconnected to the three processor packages P0 to P2. The memory device carried in the memory package M2 is shared among the three processor devices. In this case, the same storage region may be shared. Alternatively, where there is enough storage capacity, the storage region may be divided into the same number of blocks as the number of processors among which the storage region is to be shared, and the blocks of the storage region may be allocated among the processor devices. More specifically, the storage region of the memory device is divided into three blocks. The divided blocks of the storage region are allocated among the processor devices in the processor packages P0 to P2, respectively. The same applies to the other memory packages. Each memory package is shared among the processor devices in the processor packages that are opposed to the sides of the respective memory packages. The divided blocks of the storage region are allocated among the corresponding processor devices.

This embodiment also ensures equal or approximately equal electrical wiring distances between the processor packages and the memory packages. Accordingly, digital information can be exchanged for an equal transmission period between any pairs of packages. In addition, the wiring may be patterned, with a possible reduction in manufacturing costs for a board 1 for multi-processor systems.

As is apparent from the above, six memory packages (each carrying a shared memory device) are arranged around a given processor package. Each processor device is allowed to use the six memory devices at the same time. Therefore, the performance of the processor device can be drawn more efficiently than in the cases of the first and second embodiments. Processing using processing results from the three processor devices can be performed using a single memory device.

Furthermore, since the mount regions are arranged in a honeycomb pattern, the semiconductor packages can be mounted for useful purposes when the board 1 has a generally circular shape.

While the memory packages are arranged around a processor package in this embodiment, it is possible for processor packages to surround a memory package.

Fourth Embodiment

Figure 4:
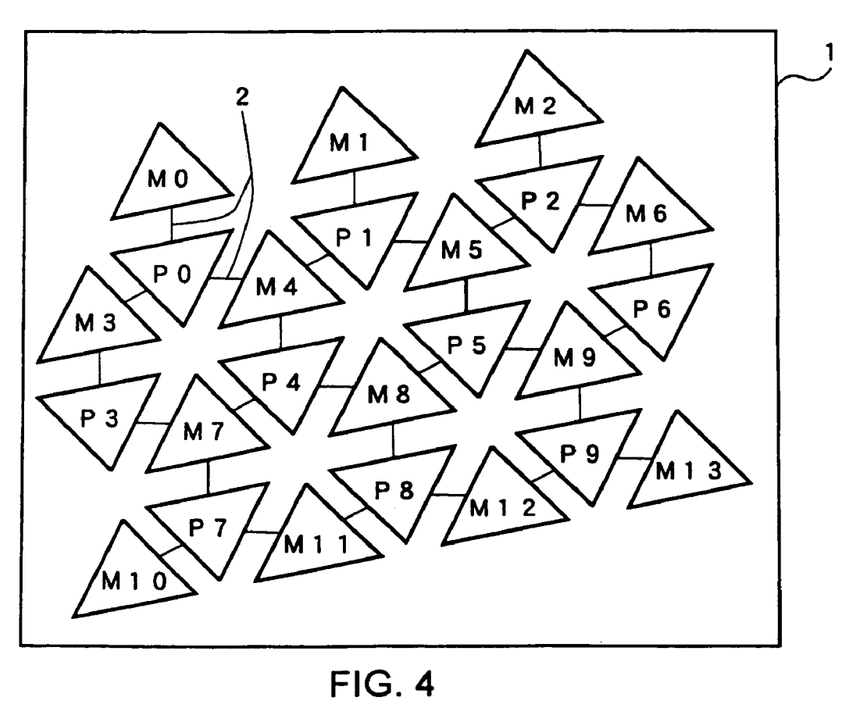
FIG. 4 is a plan view showing an example of a board in an electronic device according to a fourth embodiment of the present invention.

FIG. 4 is a plan view showing an example of a board in an electronic device according to a fourth embodiment.

In this embodiment, a plurality of triangular mount regions of equal size are provided on a board in an electronic device without a gap between them. The mounting surfaces of the semiconductor packages to be mounted are all triangular. The board in FIG. 4 carries memory packages M0 to M13 and processor packages P0 to P9. For convenience, the board and the wiring are depicted by the reference numerals 1 and 2, respectively, as in the first embodiment.

The packages are mounted so that the three sides of each processor package are opposed to one side of each of the surrounding three memory packages. For example, the three memory packages M0, M3, and M4 are provided around the processor package P0 so that the sides of the processor package P0 are opposed to one side of each of the memory packages M0, M3, and M4. The same applies to the other processor packages.

The data associated with the processing carried out by the processor devices in the processor packages are distributed over, stored in, and read out of the memory devices in the surrounding three memory packages interconnected to the relevant processor package.

Taking particular note of the memory packages, for example, the memory package M4 is interconnected through the wiring 2 to the three processor packages P0, P1, and P4. The memory device carried in the memory package M4 is shared among the processor devices in the processor packages P0, P1, and P4. In this case, the same storage region may be shared. Alternatively, where there is enough storage capacity, the storage region may be divided into the same number of blocks as the number of processors among which the storage region is to be shared, and the blocks of the storage region may be allocated among the processor devices. More specifically, the storage region of the memory device in the memory package M4 is divided into three blocks. The divided blocks of the storage region are allocated among the processor devices in the processor package P0, P1, and P4. The data associated with the processing carried out by the processor devices in the processor packages P0, P1, and P4 are stored in and read out of the divided blocks of the storage region, respectively. The same applies to the other memory packages.

This embodiment also ensures equal or approximately equal electrical wiring distances between the processor packages and the memory packages. Accordingly, digital information can be exchanged for an equal transmission period between any pairs of packages. In addition, the wiring may be patterned, with a possible reduction in manufacturing costs for a board 1 for multi-processor systems.

Furthermore, since the mount regions are arranged in a triangle pattern, the semiconductor packages can be mounted for useful purposes when the board 1 has a generally circular shape.

Fifth Embodiment

Figure 5:
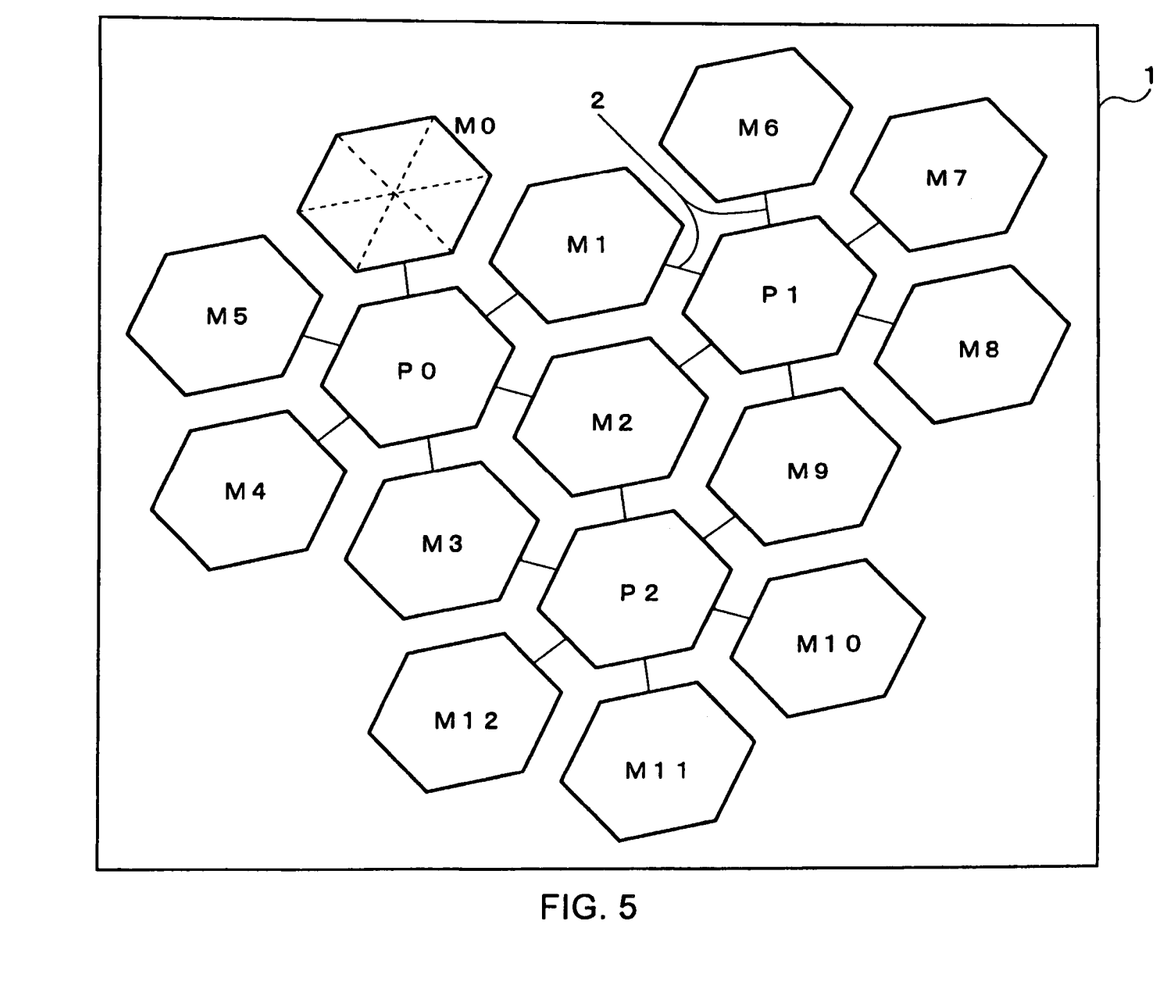
FIG. 5 is a plan view showing an example of a board in an electronic device according to a fifth embodiment of the present invention.

FIG. 5 is a plan view showing an example of a board in an electronic device according to a fifth embodiment.

An electronic device in this embodiment is a combination of the third embodiment and the fourth embodiment. More specifically, six triangular mount regions are combined into a hexagonal mount region. The hexagonal mount regions are arranged in a honeycomb pattern on a board. The hexagonal mount regions are interconnected to each other through wiring 2. The mounting surfaces of the semiconductor packages to be mounted are all triangular. By combining them, hexagons that correspond to the mount regions are formed. The board in FIG. 5 carries memory packages M0 to M12 (up to six triangular memory packages per mount region) and processor packages P0 to P2 (up to six triangular processor packages per mount region). For convenience, the board and the wiring are depicted by the reference numerals 1 and 2, respectively, as in the first embodiment.

In addition to the advantages of the third and fourth embodiments, the electronic device according to this embodiment offers the advantage that an arbitrary number (up to six) of triangular semiconductor packages can be mounted on each hexagonal region.

The triangular semiconductor packages can be mounted on the board 1 with no unnecessary gaps between the packages.

While the mount regions are hexagonal in FIG. 5, there is no limitation on the shape of the mount regions as long as the shape is produced as a combination of two or more triangles of equal size.

Sixth Embodiment

Figure 6:
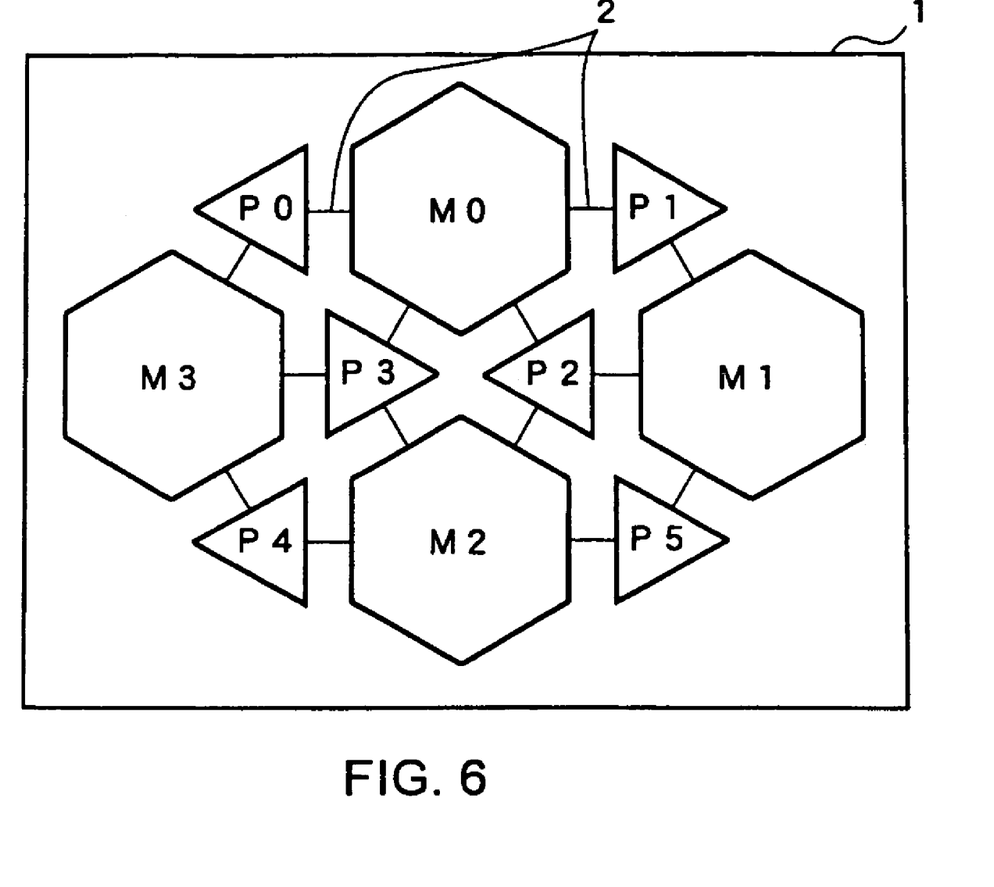
FIG. 6 is a plan view showing an example of a board in an electronic device according to a sixth embodiment of the present invention.

FIG. 6 is a plan view showing an example of a board in an electronic device according to a sixth embodiment.

In this embodiment, a plurality of mount regions of two different sizes and shapes are provided on a board in an electronic device. For example, some mount regions may be hexagonal regions, preferably, regular hexagonal regions of equal size, and the other mount regions may be triangular regions, preferably, regular triangular regions of equal size. By combining two kinds of regions, the mount regions may be arranged on the board almost without a gap between them. More specifically, the mount regions may be arranged on the board without a gap between them so that the three sides of each triangle are opposed to one side of each of the surrounding regular hexagons. The mounting surfaces of the semiconductor packages to be mounted are either regular hexagonal or regular triangular, depending on the shape of the corresponding mount regions. The board in FIG. 6 carries memory packages M0 to M3 each having a regular hexagonal mounting surface, and processor packages P0 to P5 each having a regular triangular mounting surface. For convenience, the board and the wiring are depicted by the reference numerals 1 and 2, respectively, as in the first embodiment.

The processor package P2 is interconnected through the wiring 2 to the memory packages M0, M1, and M2. The data associated with the processing carried out by the processor device in the processor package P2 are distributed over, stored in, and read out of the memory devices in the memory packages M0, M1, and M2. The same applies to the processor package P3. More specifically, the processor package P3 is interconnected to the memory packages M0, M2, and M3. The data associated with the processing carried out by the processor device in the processor package P3 are distributed over, stored in, and read out of the memory devices in the memory packages.

For the other processor packages P0, P1, P4, and P5, only two memory packages are shown just for ease of illustration. The data associated with the processing carried out by the processor devices in the processor packages P0, P1, P4, and P5 are also distributed over, stored in, and read out of the memory devices in the relevant memory packages.

Taking particular note of the memory packages, for example, the memory package M0 is interconnected to four processor packages P0 to P3. The memory device carried in the memory package M0 is shared among the four processor devices. In this case, the same storage region may be shared. Alternatively, where there is enough storage capacity, the storage region may be divided into the same number of blocks as the number of processors among which the storage region is to be shared, and the blocks of the storage region may be allocated among the processor devices. More specifically, the storage region of the memory device is divided into four blocks. The divided blocks of the storage region are allocated among the processor devices in the processor packages P0 to P3. The same applies to the other memory packages. The divided blocks of the storage region are allocated among the processor devices.

The memory package M1 is interconnected to the processor packages P1, P2, and P5. The memory device carried in the memory package M1 is shared among the three processor devices. The memory package M2 is interconnected to the processor packages P2 to P5. The memory device carried in the memory package M2 is shared among the four processor devices. The memory package M3 is interconnected to the processor packages P0, P3, and P4. The memory device carried in the memory package M3 is shared among the three processor devices.

Only three or four processor packages are interconnected to each of the memory packages M0 to M3 just for ease of illustration. One processor package can be interconnected to each side of the memory package. Accordingly, in this embodiment, up to six processor packages can be interconnected to a single memory package. The memory device in the memory package can be shared among all processor packages that are interconnected thereto.

This embodiment also ensures equal or approximately equal electrical wiring distances between the processor packages and the memory packages. Accordingly, digital information can be exchanged for an equal transmission period between any pairs of packages. In addition, the wiring may be patterned, with a possible reduction in manufacturing costs for a board 1 for multi-processor systems.

As apparent from the above, a plurality of memory packages (each carrying a shared memory device) are arranged around a single processor package. The single processor device can use the plurality of memory devices at the same time. Therefore, the performance of the processor device can be drawn more efficiently. Processing using processing results from a plurality of processor devices can be performed through a single memory device.

This embodiment employs regular triangular mount regions for the processor packages and regular hexagonal mount regions for the memory packages. However, the mount regions for the processor packages may be regular hexagonal and the mount regions for the memory packages may be regular triangular.

In the first through sixth embodiments, other semiconductor package (s), electronic part (s) and similar components may be arranged on the boards in FIG. 1 to FIG. 6. However, they are not directly associated with the implementation of the present invention and description and illustration thereof are thus omitted.

Application Modes

Next, an application mode of the electronic devices according to the above-mentioned embodiments, in particular, a method for establishing an information processing environment for these electronic devices, is described.

Figure 7:
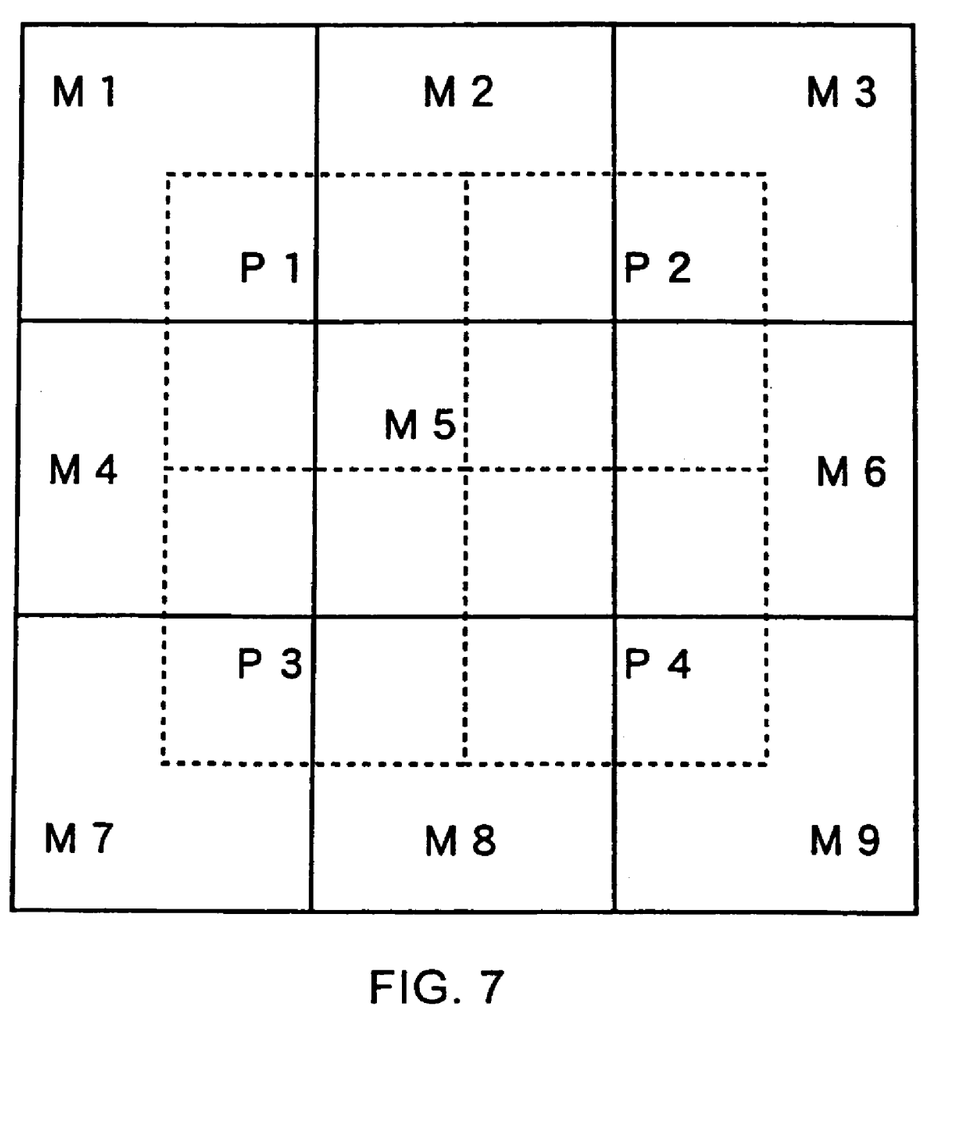
FIG. 7 is a view that schematically illustrates how processor devices are interconnected to a memory device and how the memory device is shared among the processor devices.

FIG. 7 shows the relationship between the processor packages P1 to P4 on the board 1 in FIG. 2 and the memory packages M1 to M9. The processor packages P1 to P4 are depicted by broken lines and the memory packages M1 to M9 are depicted by solid lines.

The data associated with the processing carried out by the processor device in the processor package P1 are distributed over and stored in the memory devices in the memory packages M1, M2, M4, and M5. The data associated with the processing carried out by the processor device in the processor package P2 are distributed over and stored in the memory devices in the memory packages M2, M3, M5, and M6. The data associated with the processing carried out by the processor device in the processor package P3 are distributed over and stored in the memory devices in the memory packages M4, M5, M7, and M8. The data associated with the processing carried out by the processor device in the processor package P4 are distributed over and stored in the memory devices in the memory packages M5, M6, M8, and M9.

The data associated with the processing carried out by the processor device in the processor package P2 and the data associated with the processing carried out by the processor device in the processor package P1 are both stored in the memory device in the memory package M2. In other words, the memory device in the memory package M2 contains mixed data associated with the processing carried out by the processor devices in both processor packages P1 and P2. Accordingly, the processor device in the processor package P1 can easily use the processing results obtained by the processor device in the processor package P2 through the memory device in the memory package M2. Similarly, the processor device in the processor package P2 can easily use the processing results obtained by the processor device in the processor package. P1 through the memory device in the memory package M2.

Likewise, the memory device in the memory package M4 allows each processor device in the processor packages P1 and P3 to easily use the processing results obtained by the other processor device. The memory device in the memory package M5 allows each processor device in the processor packages P1 to P4 to easily use the processing results obtained by the other three processor devices. The memory device in the memory package M6 allows each processor device in the processor packages P2 and P4 to easily use the processing results obtained by the other processor device. The memory device in the memory package M8 allows each processor device in the processor packages P3 and P4 to easily use the processing results obtained by the other processor device. Accordingly, using one of the above-mentioned electronic devices, the following information processing environment can be established.

Processing of 3D images is described using the following electronic device as an example.

The memory devices in the memory packages M1 to M9 store distributed data that represent the entire world of a 3D image. The processor devices in the processor packages P1 to P4 use the data to carry out processing required to produce the entire world of a 3D image.

A curved surface in the entire world of a 3D image is divided into grids. The data representing the curved surface are stored in the memory devices and are processed by the processor devices, based on a square of the grid as a unit.

Figure 8:
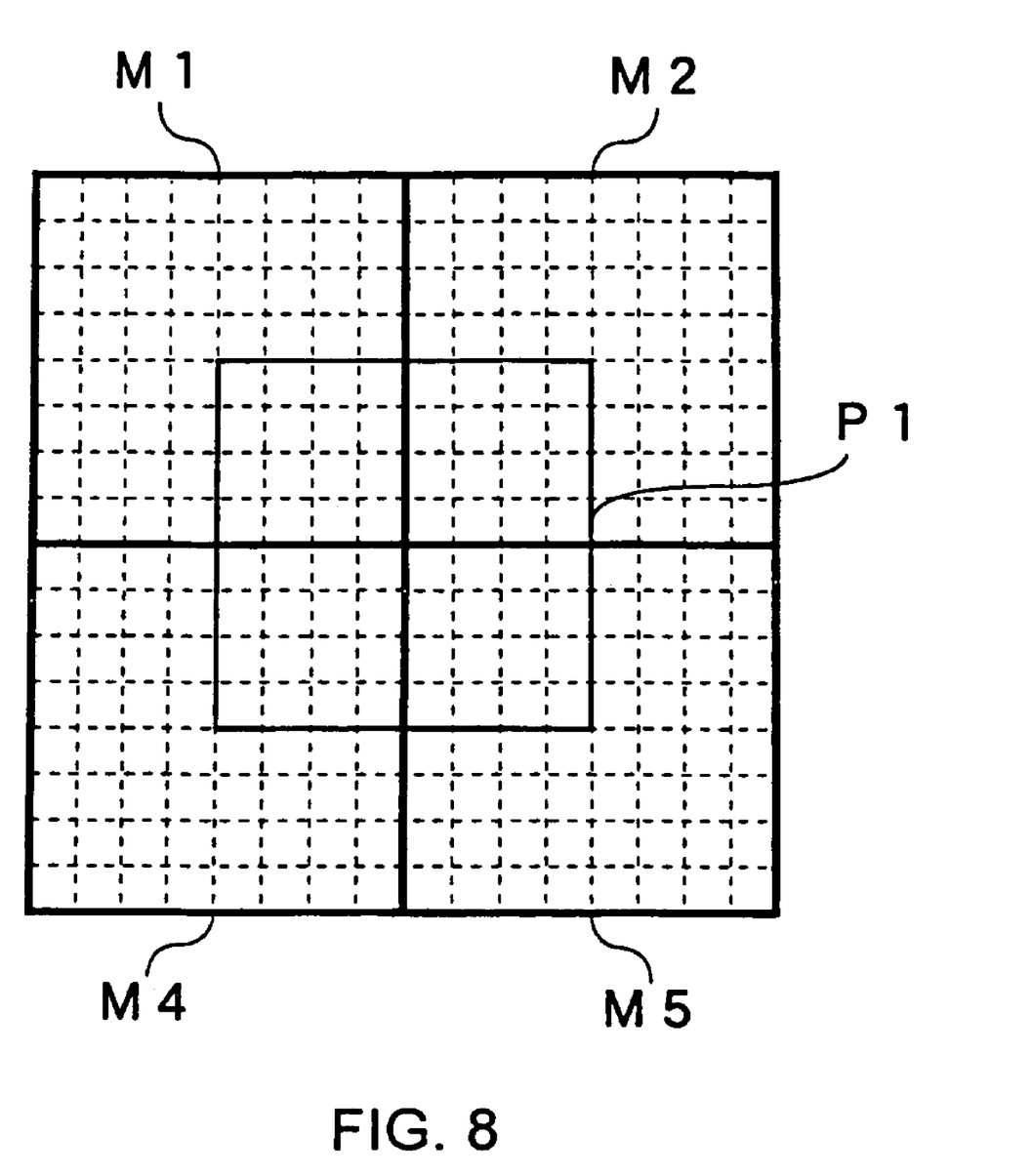
FIG. 8 is a view illustrating squares stored on memory packages M1, M2, M4, and M5 of the squares of a grid representing data for the entire world of a 3D image.

FIG. 8 illustrates data representing a curved surface that are stored in the memory devices in the memory packages M1, M2, M4, and M5. Each memory device stores the data representing a part of the curved surface corresponding to a grid of 8 by 8 in size.

The data representing a part of the curved surface that are stored in the memory device in the memory package M1 are processed by the processor device in the processor package P1. The data representing a part of the curved surface that are stored in the memory device in the memory package M2 are processed by the processor devices in the processor packages P1 and P2. The data representing a part of the curved surface that are stored in the memory device in the memory package M4 are processed by the processor devices in the processor packages P1 and P3. The data representing a part of the curved surface that are stored in the memory device in the memory package M5 are processed by the processor devices in the processor packages P1 to P4.

As an example of the processing carried out by the processor devices, processing to obtain a normal vector at each grid point is described. Normal vectors at the grid points are necessary for rendering a curved surface.

Figure 9:
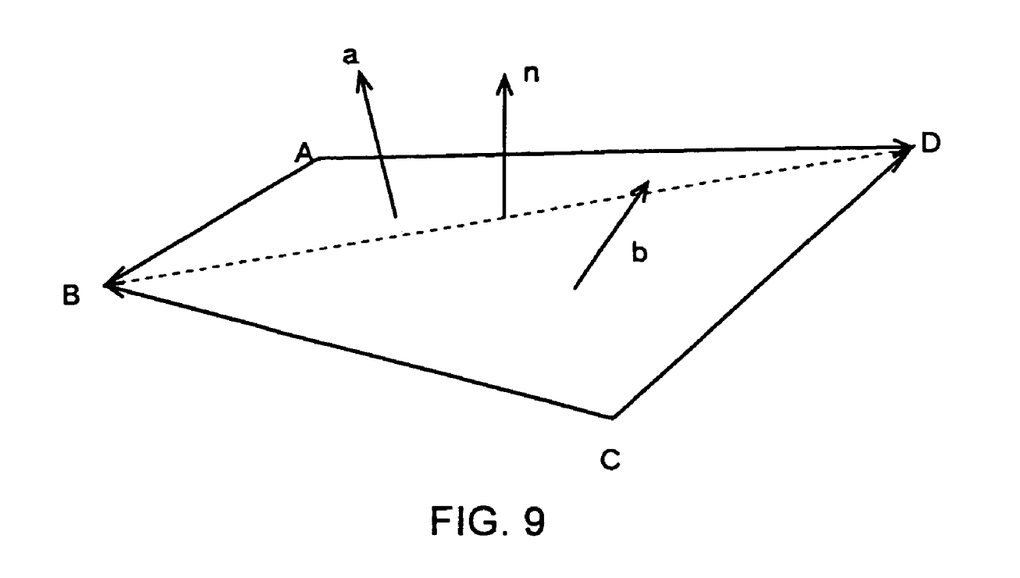
FIG. 9 is a view illustrating a normal vector for a square of a grid.

To calculate a normal vector at a grid point, normal vectors are calculated for each square of the grid. FIG. 9 is a view illustrating the normal vector n in the square ABCD of a grid.

First, the vector "a" is calculated from the vectors AB and AD using the vector cross product. The vector "b" is calculated from the vectors CB and CD using the vector cross product. The normalized sum of the vectors "a" and "b" corresponds to the normal vector n for the illustrated square of the grid. This can be explained as follows.

$$\vec{a} = \vec{AB} \times \vec{AD}$$

$$\vec{b} = \vec{CB} \times \vec{CD}$$

$$\vec{n} = (\vec{a} + \vec{b})/|\vec{a} + \vec{b}| \qquad \text{Equation 1}$$

Figure 10:
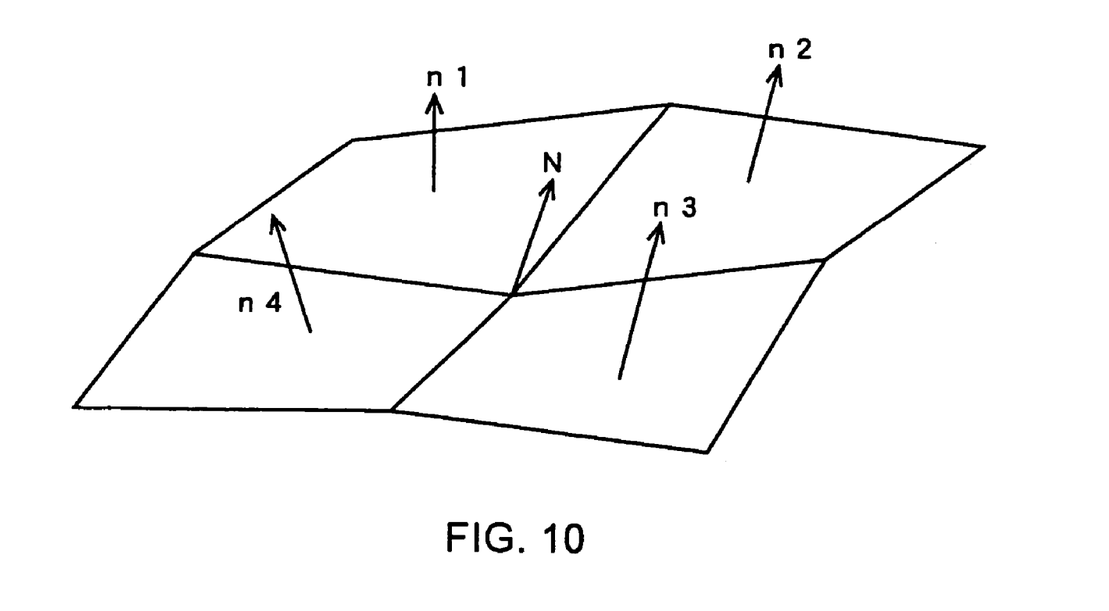
FIG. 10 is a view illustrating a normal vector at a grid point.

After the normal vectors for the squares of the grid are calculated, normal vectors at the grid points are calculated. The normal vector at a given grid point is the normalized sum of the normal vectors for the four squares of the grid that share the subject grid point (FIG. 10). Let the normal vectors for the four squares of the grid be the vectors n1 to n4, respectively, and the normal vector at the grid point be the vector N, then the vector N can be given by the following equation.

$$\vec{N} = (\vec{n1} + \vec{n2} + \vec{n3} + \vec{n4}) / |\vec{n1} + \vec{n2} + \vec{n3} + \vec{n4}| \qquad \text{Equation 2}$$

Figure 11:
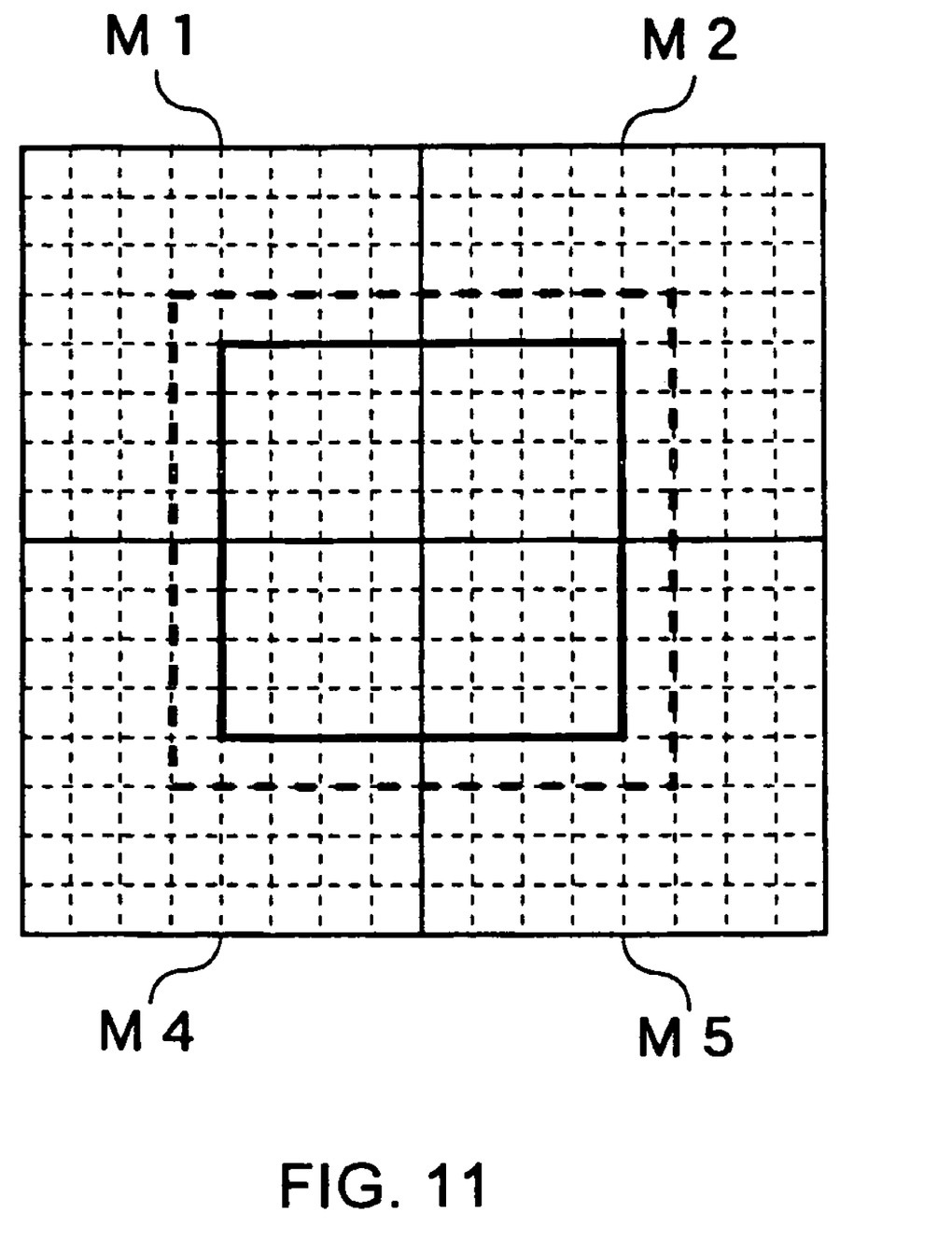
FIG. 11 is a view of processing carried out by a processor package P1.

In order to calculate the normal vectors at the grid points in the range delimited by the heavy black line in FIG. 11 along with those at the grid points on the line, it is necessary to calculate the normal vectors for the squares of the grid in the range delimited by the broken line. The normal vectors at the grid points enclosed in the heavy black line except for those on the line are calculated by the processor device in the processor package P1.

For a memory package to which only one processor package is interconnected, all data that are stored in the memory device in the memory package are subjected to calculation by the processor device in the single processor package.

The normal vectors for the squares between the heavy black line and the broken line that are stored in the memory device in the memory package M1 are calculated by the processor device in the processor package P1. Therefore, the normal vectors at the grid points on the heavy black line that are stored in the memory device in the memory package M1 are calculated by the processor device in the processor package P1.

The normal vectors for the squares between the heavy black line and the broken line that are stored in the memory device in the memory package M2 are calculated by the processor device in the processor package P1 or P2. Therefore, the normal vectors at the grid points on the heavy black line that are stored in the memory device in the memory package M2 are calculated by the processor device in the processor package P1 or P2.

The normal vectors for the squares between the heavy black line and the broken line that are stored in the memory device in the memory package M4 are calculated by the processor device in the processor package P1 or P3. Therefore, the normal vectors at the grid points on the heavy black line that are stored in the memory device in the memory package M4 are calculated by the processor device in the processor package P1 or P3.

The normal vectors for the squares between the heavy black line and the broken line that are stored in the memory device in the memory package M5 are calculated by the processor device in one of the processor packages P1 to P4. Therefore, the normal vectors at the grid points on the heavy black line that are stored in the memory device in the memory package M5 are calculated by the processor devices in the processor packages P1 to P4.

Conventionally, in order to use processing results obtained by other processor devices (i.e., normal vectors for squares of a grid that are calculated by other processor devices), a processor device must access through the relevant other processor devices the memory device that stores the desired processing result(s).

On the contrary, according to the present invention, the memory devices are shared among a plurality of processor devices. This means that necessary data are stored in the same memory device. Processing results obtained by any processor devices are available for all processor devices without the above-mentioned conventional problems.

The connection paths between the processor package P1 and each of the memory packages M1, M2, M4, and M5 are equal in length. This ensures an identical time duration for the processor device to access each of the memory devices.

While the above-mentioned example is for the electronic device according to the second embodiment, similar application modes (establishment of an information processing environment) can be applied to the electronic devices according to other embodiments. In other words, the electronic device of any one of the above-mentioned embodiments can be used to implement a similar configuration wherein the processor devices distribute data over a plurality of memory devices and wherein the memory devices read and store the data from the processor devices.

In the above-mentioned embodiments, the mount regions the semiconductor packages are arranged on the board in the electronic device. However, the following embodiment can be contemplated for a semiconductor package and a semiconductor device according to the present invention.

For semiconductor packages, a board for a semiconductor package is used in place of the above-mentioned board in the electronic device. On the board for the semiconductor package, semiconductor devices such as memory devices or processor devices are mounted in place of the semiconductor packages of the first to sixth embodiments. Accordingly, mount regions for that purpose are provided on the board for the semiconductor package.

More specifically, two semiconductor devices are alternately arranged in rows and columns on the board for the semiconductor package, as in the first to sixth embodiments. Alternatively, they may be arranged in a honeycomb pattern. The shape of the semiconductor device is not limited to a conventional rectangle. Instead, it may be triangular or hexagonal in order to fit to the mount regions.

As in the first to sixth embodiments, this configuration ensures equal or approximately equal electrical wiring distances between a specific semiconductor device and each of a plurality of semiconductor devices adjacent to the specific semiconductor device.

For semiconductor devices, two different function implementation segments, such as function implementation segments that serve as processors and function implementation segments that serve as memories, are arranged with similar shapes and patterns to those described in conjunction with the first to sixth embodiments.

This configuration ensures equal or approximately equal electrical wiring distances between a specific function implementation segment and each of a plurality of function implementation segments adjacent to the specific function implementation segment, as in the first to sixth embodiments.

As apparent from the above, the electronic device according to the present invention offers an efficient arrangement of a plurality of semiconductor packages on a board. In addition, by using the above-mentioned electronic device, information processing can be performed with a high degree of efficiency by means of cooperating semiconductor devices with each other.

The semiconductor device of the present invention allows a plurality of function implementation segments to be formed efficiently. In addition, information processing can be performed with a high degree of efficiency through cooperation of the function implementation segments.

Although the invention herein has been described with reference to particular embodiments, it is to be understood that these embodiments are merely illustrative of the principles and applications of the present invention. It is therefore to be understood that numerous modifications may be made to the illustrative embodiments and that other arrange-

The invention claimed is:

1. An electronic device, comprising:
   a plurality of mount regions provided in the electronic device, each of said mount regions being electrically interconnected to other of said mount regions;
   a semiconductor package mounted on each of at least two of said mount regions, each of said semiconductor packages being electrically interconnected to other of said semiconductor packages so that each of said semiconductor packages and being different than said other of said semiconductor packages can implement a desired function in cooperation with said other of said semiconductor packages to which it is electrically interconnected;
   each of said mount regions being positioned in the electronic device so that each of said semiconductor packages is spaced from adjacent semiconductor packages by a wiring distance, said wiring distance between each adjacent pair of semiconductor packages being about the same; a board; and at least one non-mount region on which no semiconductor package is mounted; said mount regions and said non-mount regions having rectangular shapes of equal size and being alternately arranged in rows and columns on said board to form a matrix pattern.

2. The electronic device as claimed in claim 1, wherein each of said mount regions has a shape, and each of said semiconductor packages has a mounting surface having a shape, said shape of each of said mounting surfaces being the same as said shape of said mount region on which said semiconductor package is mounted.

3. The electronic device as claimed in claim 2, wherein each of said semiconductor packages includes a semiconductor device, for each of said semiconductor packages, said semiconductor device in said semiconductor package mounted on one of said mount regions being different from said semiconductor device in said semiconductor package mounted on another of said mount regions adjacent to said one of said mount regions.

4. The electronic device as claimed in claim 3, wherein said one of said mount regions includes an active device package having an active device, and said another of said mount regions includes a passive device package having a passive device.

5. The electronic device as claimed in claim 4, further comprising:
   a plurality of active device packages, each of said active device packages including an active device, each of said active device packages being mounted on a mount region adjacent to said another of said mount regions, said passive device being shared among said active devices.

6. The electronic device as claimed in claim 4, further comprising:
   a plurality of passive device packages, each of said passive device packages including a passive device, each of said passive device packages being mounted on a mount region adjacent to said one of said mount regions, said active device communicating with each of said passive devices.

7. The electronic device as claimed in claim 6, further comprising:
   a plurality of active device packages, each of said active device packages including an active device, each of said active device packages being mounted on a mount region adjacent to a mount region having one of said passive device packages, at least one of said passive devices being shared among at least a portion of said active devices, said active devices being configured so that each of said active devices in said portion of said active devices is able to read through said at least one passive device digital information generated by other of said active devices in said portion of said active devices.

8. The electronic device as claimed in claim 4, wherein said active device is a processor device capable of reading digital information, and said passive device is a memory device for storing said digital information.

* * * * *